US007202919B2

United States Patent
Edwards

(10) Patent No.: US 7,202,919 B2
(45) Date of Patent: Apr. 10, 2007

(54) HOLOGRAPHIC DATA STORAGE WITH PDLC SPATIAL LIGHT MODULATOR GENERATING REFERENCE AND OBJECT BEAMS

(75) Inventor: Jathan D. Edwards, Afton, MN (US)

(73) Assignee: Imation Corp., Oakdale, MN (US)

( * ) Notice: Subject to any disclaimer, the term of this patent is extended or adjusted under 35 U.S.C. 154(b) by 198 days.

(21) Appl. No.: 10/889,728

(22) Filed: Jul. 13, 2004

(65) Prior Publication Data
US 2006/0012725 A1    Jan. 19, 2006

(51) Int. Cl.
G02F 1/135 (2006.01)
(52) U.S. Cl. .......................... 349/25; 359/11; 369/103; 369/112.02
(58) Field of Classification Search .................. 359/11; 349/25–30; 369/103, 112.02
See application file for complete search history.

(56) References Cited

U.S. PATENT DOCUMENTS

| 4,104,489 | A | 8/1978 | Satoh et al. | |
|---|---|---|---|---|
| 5,307,184 | A | 4/1994 | Nishiwaki et al. | |
| 5,311,033 | A | 5/1994 | Disanayaka | |
| 5,719,691 | A | 2/1998 | Curtis et al. | |
| 6,538,776 | B2 | 3/2003 | Edwards | |
| 6,762,865 | B1 | 7/2004 | Edwards | |
| 2002/0080466 | A1* | 6/2002 | Bayart et al. | 359/295 |
| 2004/0145994 | A1* | 7/2004 | Tsukagoshi | 369/103 |

OTHER PUBLICATIONS

Chapter 6: Technical Evaluation of Work, http://www.wtec.org/loyola/dsply_jp/c6_s3.htm.
"Spatial Light Modulator Device With Diffusive Element," U.S. Appl. No. 10/889,727, filed Jul. 13, 2004.

* cited by examiner

Primary Examiner—Andrew Schechter
Assistant Examiner—Phu Vu
(74) Attorney, Agent, or Firm—Eric D. Levinson

(57) ABSTRACT

The invention is directed to a holographic data storage system including a spatial light modulator device (SLM) that comprises optical elements in the form of polymer dispersed liquid crystal (PDLC) elements. The PDLC elements are individually controllable, and can be made substantially transparent or substantially diffusive. The "on" or "off" state of each PDLC element is defined by whether the given PDLC element is transparent or diffusive. Additional states may also be defined for the PDLC elements, e.g., based on a level of diffusiveness of the PDLC elements. Also, a mirror layer may be added adjacent the PDLC elements to define a reflective-mode SLM. In any case, the SLM is used to encode bit maps into a holographic object beam.

9 Claims, 6 Drawing Sheets

HOLOGRAPHIC DATA STORAGE WITH PDLC SPATIAL LIGHT MODULATOR GENERATING REFERENCE AND OBJECT BEAMS

TECHNICAL FIELD

The invention relates to spatial light modulator devices (SLMs) used to control light on a pixel-by-pixel basis, and more particularly holographic data storage systems making use of SLMs.

BACKGROUND

Spatial light modulator devices (SLMs) are used in several areas where the control of light on a pixel-by-pixel basis is needed. For example, SLMs have been used in optical data processing, adaptive optics, optical correlation, machine vision, image processing, image analysis, beam steering, displays, and holographic data storage systems. Many different types of SLMs exist for these and other applications.

In general, an SLM includes a set of controllable optical elements that define a pixel array. The SLM receives input light, and each of the optical elements manipulate a portion of the input light to define the state of a given pixel. For example, each of the optical elements of conventional SLMs can be controlled to be in an "on" state or an "off" state. By controlling which optical elements are "on" and which are "off," the output of the SLM can be encoded on a pixel-by-pixel basis.

Conventional SLMs are typically either reflective-mode SLMs or transmissive-mode SLMs. In conventional reflective-mode SLMs, the controllable optical elements comprise specular mirrors. In that case, the orientation of the mirrors can be controlled to define the on/off state of pixels, based on the direction that output light is directed from the different mirrors. In conventional transmissive-mode SLMs, the set of elements that can be made transmissive or opaque in order to either pass or block light and thereby define the on/off state of the respective pixels. Machine words may be defined for certain pixel arrays or subsets of the pixel arrays.

For holographic data storage, SLMs are used to encode pixel arrays that comprise bit maps into an object beam of the system. In particular, when input light for the object beam illuminates the SLM, the SLM can encode information into the object beam by controlling which pixels are "on" and which pixels are "off." The encoded object beam is then made to interfere with a reference beam to record a hologram in the medium. When a stored hologram is later illuminated with only the reference beam, some of the reference beam light is diffracted by the hologram interference pattern. Moreover, the diffracted light can be directed to reconstruct the original encoded object beam. Thus, by illuminating a recorded hologram with the reference beam only, the data encoded in the object beam can be reconstructed and detected by a data detector such as a camera or other image capture device. In this manner, information stored in a recorded hologram can be read from a holographic medium.

SUMMARY

In general, the invention is directed to a spatial light modulator device (SLM) suitable for use in holographic data storage applications, and various methods and systems using the SLM for holographic data storage. The SLM includes optical pixel elements in the form of polymer dispersed liquid crystal (PDLC) elements. The PDLC elements are individually controllable pixels, and can be made substantially transparent or substantially diffusive. In particular, an electrical field can be individually applied to the different PDLC elements to make the elements substantially transparent. However, if no electrical field is applied to a given PDLC element, the element remains substantially diffusive. Thus, an array of pixels are defined by the SLM based on whether the input light is scattered by one or more of the PDLC elements. The "on" or "off" state of each PDLC element is defined by whether the given PDLC element is transparent or diffusive. In other examples, the on" or "off" state of each PDLC element is defined by whether the given PDLC element appears specular or diffusive. In that case, one or more specular mirrors can be positioned adjacent the PDLC elements to define a reflective-mode SLM. Moreover, in still other examples, more than two states may also be defined for the PDLC elements, e.g., based on a level of diffusiveness of the PDLC elements.

In one embodiment, the invention provides a method comprising controlling first polymer dispersed liquid crystal (PDLC) elements of a spatial light modulator such that the first PDLC elements are substantially transparent, controlling second PDLC elements such that the second PDLC elements are substantially diffusive, and illuminating the spatial light modulator to encode a pixel array into an object beam of a holographic data storage system.

In another embodiment, the invention provides a method comprising controlling first polymer dispersed liquid crystal (PDLC) elements of a spatial light modulator such that the first PDLC elements define a first level of transmissiveness and a first level of diffusiveness, controlling second PDLC elements of the spatial light modulator such that the second PDLC elements define a second level of transmissiveness and a second level of diffusiveness, and illuminating the spatial light modulator to encode a pixel array into an object beam of a holographic data storage system. In this case, controlling the first PDLC elements may comprise applying a first electric field to the first PDLC elements, and controlling the second PDLC elements may comprise applying a second electric field to the second PDLC elements. Alternatively, controlling the first PDLC elements may comprise applying an electric field to the first PDLC elements, and controlling the second PDLC elements may comprise applying no electric field to the second PDLC elements.

In another embodiment, the invention provides a holographic data storage system comprising a holographic medium, a laser to generate input light, and a spatial light modulator device positioned to generate a data encoded object beam from the input light. The spatial light modulator device may comprise controllable polymer dispersed liquid crystal (PDLC) elements that control the input light on a pixel-by-pixel basis. The system can be arranged such that the data encoded object beam and a reference beam interfere in the holographic medium to create a hologram in the holographic medium.

The various embodiments of the invention may provide one or more advantages. In particular, the described SLM may provide improved performance for holographic data storage applications. In that case, the diffusion by some of the elements may provide scattering effects that reduce or eliminate zero-order burning or overexposure of zero-order Fourier components when Fourier transform holograms are stored. Moreover, in some embodiments, a holographic data storage system may be arranged so that a holographic reference beam is created from a portion of the input light that passes through the controllable PDLC elements that are made substantially transparent.

Also, in some cases, more than two pixel states can be defined for different PDLC elements, e.g., by providing three or more different electrical fields across different PDLC elements. In that case, the SLM may improve data storage capacities of holographic data storage systems by providing more complex encoding in data storage holograms.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

In FIG. 4, no electrical field is applied to the element and in FIG. 5, the electrical field is applied to commonly orient the liquid crystals.

DETAILED DESCRIPTION

The invention is directed to a spatial light modulator device (SLM) suitable for use in holographic data storage applications, and various methods and systems using the SLM for holographic data storage. The SLM includes optical elements in the form of polymer dispersed liquid crystal (PDLC) elements. The PDLC elements comprise liquid crystalline droplets embedded in a polymeric matrix. The PDLC elements are individually controllable by an applied electric field, and can be made substantially transparent or substantially diffusive depending on the optical indices of refraction of the polymeric matrix and the liquid crystal. In particular, an electric field can be individually applied to the different PDLC elements to cause the liquid crystalline droplets to align with the applied field. In this case, the optical index of refraction of the liquid crystalline droplets may match that of the polymeric matrix material to make the elements substantially transparent. However, if no electrical field is applied to a given PDLC element, the liquid crystalline orientation remains random, the optical indices are mismatched, and the element remains substantially diffusive.

Thus, an array of pixels are defined by the SLM based on whether the input light is scattered by one or more of the PDLC elements. The "on" or "off" state of each PDLC element is defined by whether the given PDLC element is transparent or diffusive. Additional states, i.e., more than the two on/off states, may also be defined for the PDLC elements based on a level of transmissiveness or diffusiveness of the PDLC elements. Also, in other embodiments, a reflective-mode SLM may include a reflective layer adjacent the PDLC elements so that the elements appear specular or diffusive, and in that case, varying levels of diffusiveness may also be used to define additional pixel states.

The described SLMs may be well suited for holographic data storage applications. In particular, the diffusion caused by some of the elements may provide scattering effects that reduce or eliminate zero-order burning or overexposure of zero-order Fourier components when Fourier transform holograms are stored. Moreover, a holographic data storage system may be arranged so that a holographic reference beam is created from a portion of the input light that passes through the controllable PDLC elements that are made substantially transparent.

Figure 1:
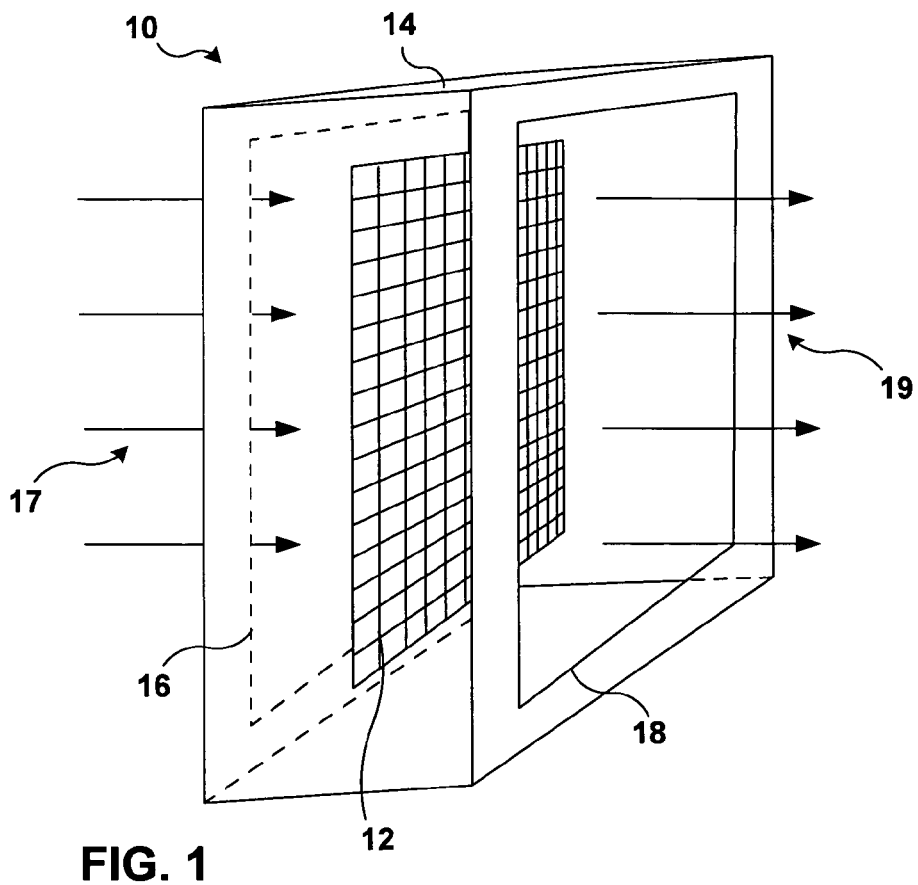
FIGS. 1 and 2 are a conceptual perspective views of spatial light modulator devices (SLMs) according to embodiments of the invention.

FIG. 1 is a conceptual perspective view of a spatial light modulator device (SLM) 10 according to an embodiment of the invention. SLM 10 comprises controllable polymer dispersed liquid crystal (PDLC) elements 12 that control input light on a pixel-by-pixel basis. In particular, each of the PDLC elements 12 is individually controllable. An electrical field, e.g., a potential difference, can be applied across a given PDLC element causing liquid crystals of the PDLC element to commonly align. In that case, the PDLC element will be transparent because the index of refraction of the aligned liquid crystalline droplets within the PDLC element will be matched to the index of refraction of the polymeric matrix. The degree of optical clarity or transparency depends on the optical indices of refraction of the aligned liquid crystalline material and the polymeric matrix.

If no electrical field is applied across a given PDLC element, the liquid crystals of that PDLC element will be randomly oriented, mismatching the optical indices of liquid crystalline droplets with that of the polymeric matrix and making the PDLC element diffusive. The degree of diffusivity depends on the optical indices of the randomly oriented liquid crystalline droplets and the polymeric matrix. In this manner, PDLC elements 12 can be individually controlled to define on/off pixel states. In some embodiments, the level of diffusion can be more precisely controlled based on the strength of the electrical field applied across a given PDLC element. In that case, multiple states may be defined for a given pixel. This may be advantageous in holographic storage applications, for example, by enabling more complex encoding in holographic bit maps, which may improve storage capacity in a holographic data storage system. A range of different levels of liquid crystal element alignment may be achieved by applying a range of different electrical fields across different ones of PDLC elements 12. Accordingly, a range of different levels of diffusiveness and transmissiveness may be defined for different ones of PDLC elements 12.

SLM 10 of FIG. 1 is a transmissive-mode SLM. PDLC elements 12 may be housed within a housing 14. Housing 14 may include an input window 16 and an output window 18. Input light 17 illuminates PDLC elements 12 through input window 16. In the simplest case, PDLC elements 12 are individually controlled to be either substantially transparent or substantially transmissively diffusive. In this manner, on/off states of pixels can be defined. In different implementations, the "on" state may correspond to either the transparent or diffusive state. Machine words may also be defined for certain pixel arrays or subsets of the pixel arrays defined by the collective states of elements 12. Output light 19 passes from PDLC elements 12 through output window 18, and is encoded with the pixel array defined by elements 12.

Figure 2:
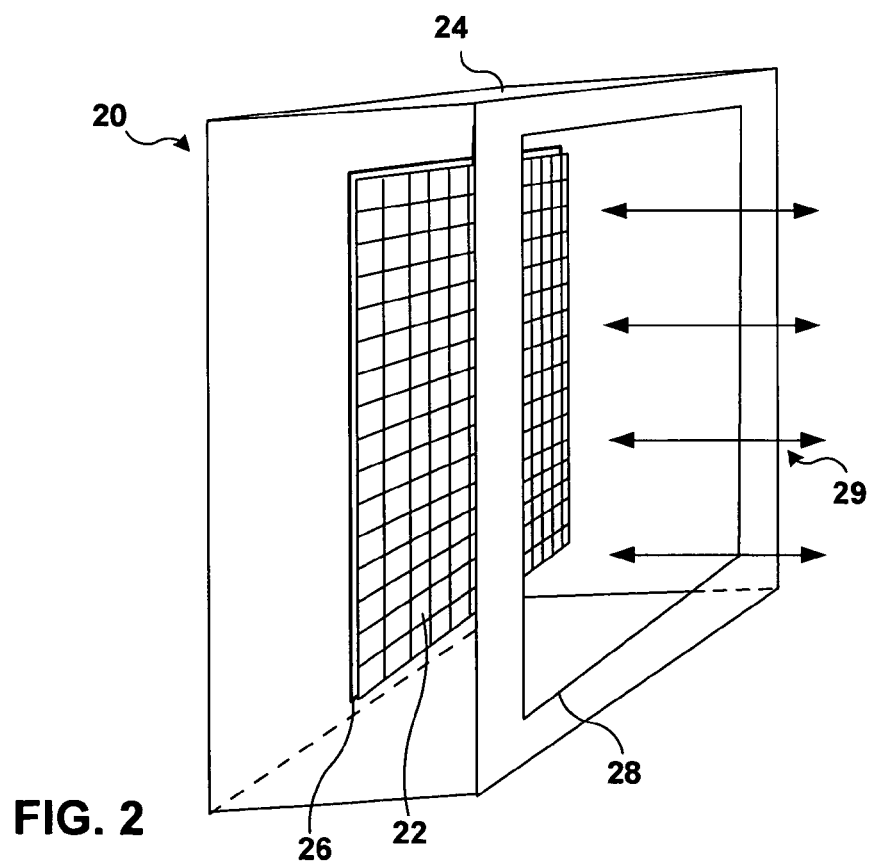

FIG. 2 is another conceptual perspective view of a spatial light modulator device (SLM) 20 according to an embodiment of the invention. SLM 20 of FIG. 2 is a reflective-mode PDLC SLM wherein PDLC elements 22 are adjacent a mirror layer 26 which reflects the light back through PDLC elements 22. Mirror layer 26 may comprise a single specular surface or a plurality of specular surfaces. In this manner, PDLC elements 22 control the reflectivity of input light on a pixel-by-pixel basis. In this case, however, PDLC elements 22 are individually controlled to appear either substantially specular or diffusive in reflectance, because of the presence of mirror layer 26.

PDLC elements 22 may be housed within a housing 24. Housing 24 may include a window 28 used for input and output. Input light 29 illuminates PDLC elements 22 through window 28. Each of PDLC elements 22 is individually controllable. An electrical field, e.g., a potential difference, can be applied across a given PDLC element causing liquid crystalline droplets within the PDLC element to commonly align. In that case, the given PDLC element will appear specular, and light traversing that element and reflecting off layer 26 will exit through window 28 with specular reflectance.

If no electrical field is applied across a given PDLC element, the liquid crystals of that PDLC element will be randomly oriented, making the PDLC layer diffusive. The light traverses the diffusive PDLC element, reflects off layer 26, traverses back through the diffusive PDLC element, and exits through window 28 with diffusive reflectance. In this manner, PDLC elements 22 can be individually controlled to define on/off pixel states. The materials selected and used for the liquid crystalline and polymeric matrix elements of the PDLC determine the degree of clarity or diffusivity of the two pixel states. Again, in some embodiments, the level of diffusion can be more precisely controlled based on the strength of the electrical field applied across a given PDLC element. In that case, multiple states may be defined for a given pixel. For example, a first electrical field, a second electrical field, a third electrical field, a fourth electrical field, and so forth, may be used to define different levels of diffusion by different ones of PDLC elements 12 (FIG. 1) or 22 (FIG. 2).

Figure 3:
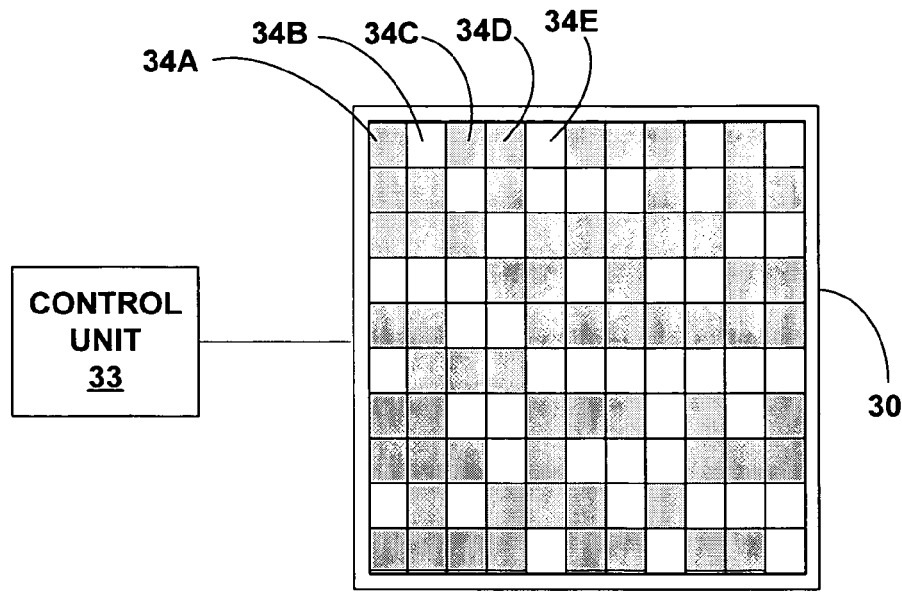
FIG. 3 is a conceptual block diagram showing an SLM coupled to a control unit that controls the individual elements of the SLM.

FIG. 3 is a conceptual block diagram showing a spatial light modulator device (SLM) 30 coupled to a control unit 33 that controls the individual PDLC elements 34 of device 30. SLM 30 may be a transmissive-mode SLM or a reflective-mode SLM. Only PDLC elements 34A–34E are labeled for simplicity. PDLC elements 34 may comprise a two-dimensional array, although the invention is not necessarily limited in that respect.

Again, PDLC elements 34 may comprise elements that can be made transmissively diffusive or transparent. Alternatively, PDLC elements 34 may comprise elements that can be made to appear reflectively diffusive or specular, e.g., with the addition of a mirror layer adjacent the elements. Control unit 33 controls which PDLC elements 34 are made diffusive.

Control unit 33 may comprise a software module that executes in a general purpose microprocessor in an operating system environment. For example, control unit 33 may be implemented as software and executed on the processor of a separate computer or workstation. If SLM 30 is used in holographic data storage applications, control unit 33 may form part of a software driver for a holographic media drive. In that case, control unit 33 defines the bit maps that are encoded in the object beam.

Figure 4:
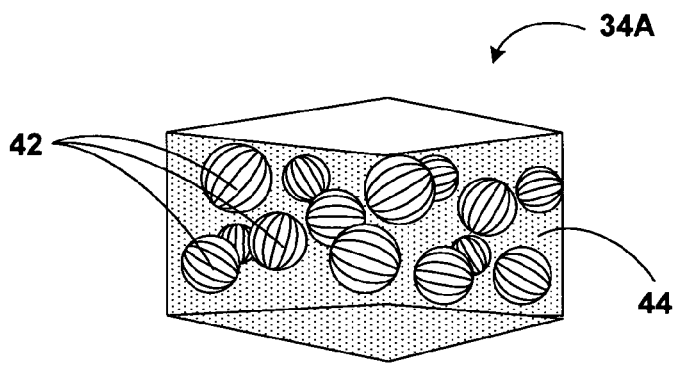
FIGS. 4 and 5 are conceptual perspective views of an exemplary polymer dispersed liquid crystal (PDLC) element.
Figure 5:
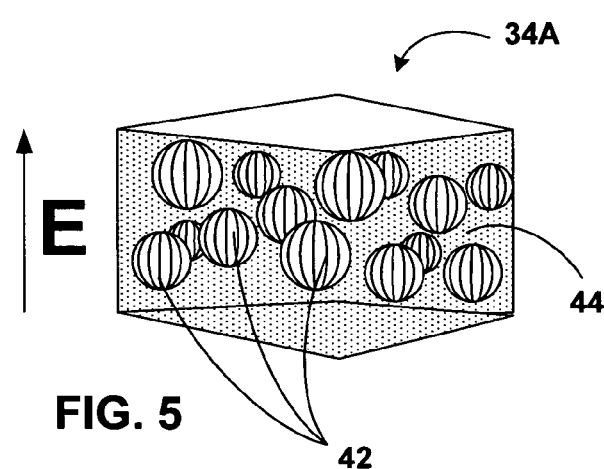

FIGS. 4 and 5 are conceptual perspective views of an exemplary polymer dispersed liquid crystal (PDLC) element, e.g., which may correspond to element 34A or any of the other PDLC elements 34. In FIG. 4, no electrical field is applied to PDLC element 34A. Accordingly, liquid crystal elements 42 are randomly oriented making PDLC element 34A diffusive. In FIG. 5, an electrical field is applied to PDLC element 34A. Accordingly, liquid crystal elements 42 are commonly oriented, making PDLC element 34A transparent. Again, various levels of diffusiveness may also be defined by selecting different electric field levels for the different PDLC elements 34, which may allow for more complex encoding by the SLM.

PDLCs generally consist of liquid crystalline droplets 42 that are dispersed in a polymer matrix 44. The resulting material is a polymer mixture that includes the liquid crystalline droplets 42 randomly interspersed throughout polymer matrix 44 in a typically 30–70% liquid crystalline to polymer matrix mixture. By changing the orientation of the liquid crystal elements 42 with an electric field, it is possible to affect transmitted light. In particular, as mentioned above, if no field is applied as shown in FIG. 4, liquid crystal elements 42 are randomly oriented, making PDLC element 34A diffusive. However, when an electrical field is applied across PDLC element 34A, liquid crystal elements 42 become commonly oriented, which makes PDLC element 34A substantially transparent. The invention employs PDLC elements to replace conventional optical elements, such as the controllable mirrors of conventional SLMs. For reflective mode SLMs, one or more mirrors can be used to reflect the transmitted or diffused light of the different PDLC elements.

An SLM which makes use of PDLC elements may provide improved performance for certain applications relative to conventional SLMs. For example, the described SLM may be well suited for holographic data storage applications. In that case, the diffusion by some of the elements may provide scattering effects that reduce or eliminate zero-order burning or overexposure of zero-order Fourier components when Fourier transform holograms are stored. Moreover, a holographic data storage system may be arranged so that a holographic reference beam is created from a portion of the input light that passes through the controllable PDLC elements that are made substantially transparent. Furthermore, the degree of diffusivity or scattering of the PDLC SLM may be tailored to the capture angle of the collection or imaging optics. For instance, an F/1 optic collects approximately +/−26 degrees off-axis or an F/2 optic collects approximately +/−14 degrees off-axis. Careful selection of the PDLC composition materials may be made to promote low angle scattering suitable for such optics. In particular, preferable embodiments of the invention include scattering of more than 50% of the light incident on a diffusive element to fall within +/−26 degrees of the optical axis or within +/−14 degrees of the optical axis. Also, the level of diffusion can be controlled based on the strength of the electrical field applied across a given PDLC element, and, in that case, multiple states may be defined for a given pixel. In holographic storage applications, this may enable more complex encoding, which may improve storage capacity in a holographic data storage system.

Figure 6:
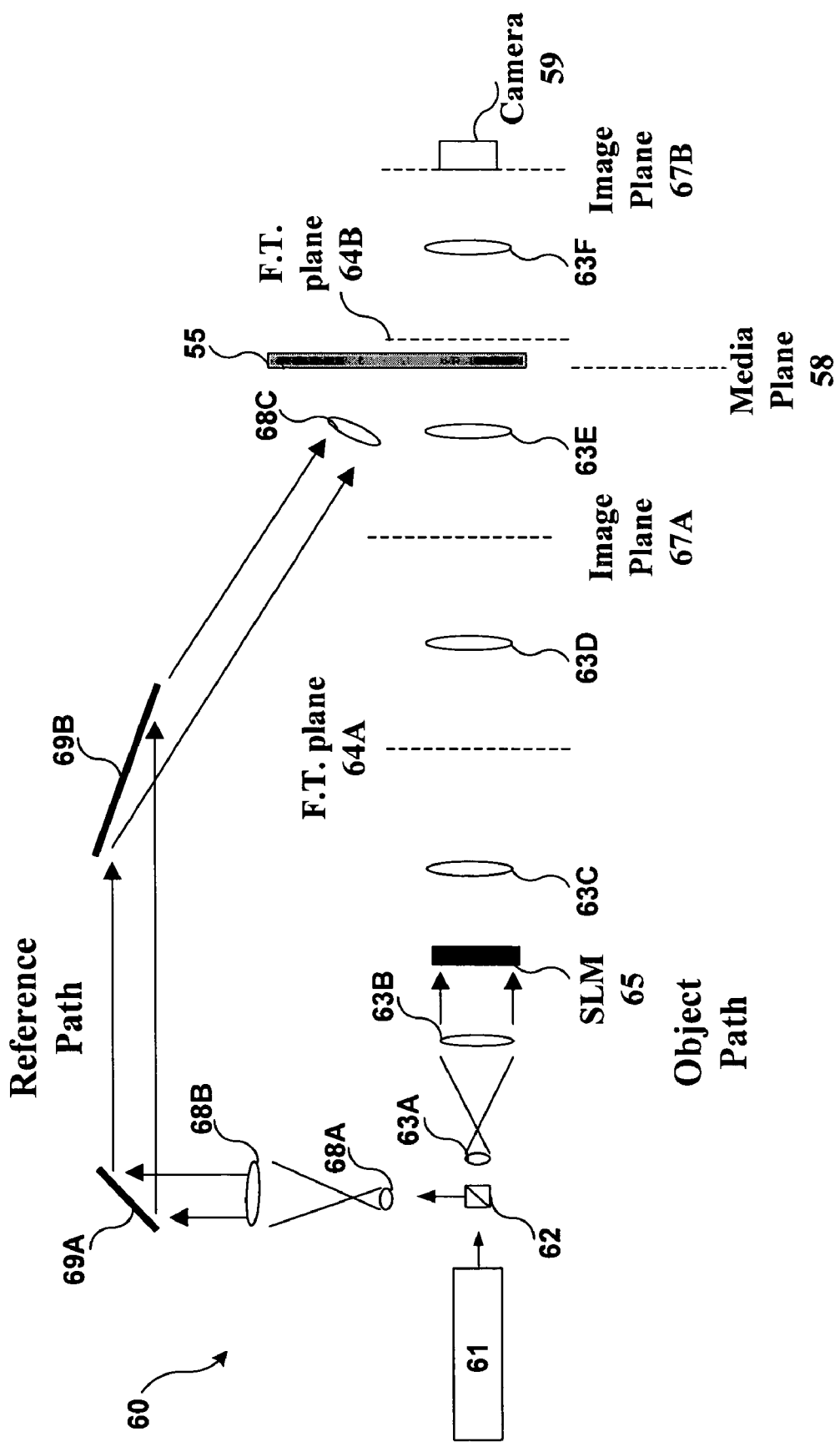
FIGS. 6–8 are block diagrams illustrating exemplary holographic data storage systems according to embodiments of the invention.
Figure 7:
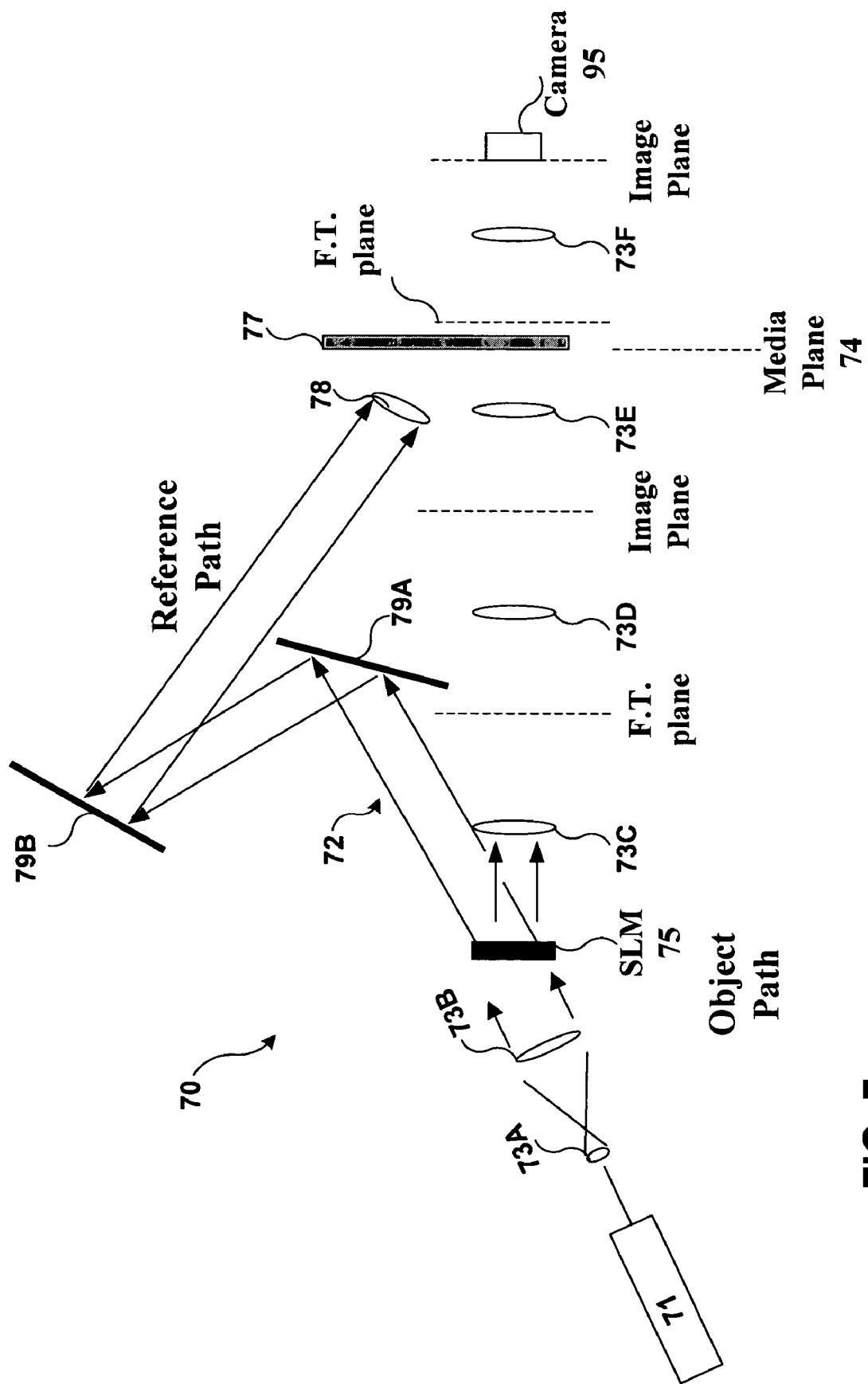
Figure 8:
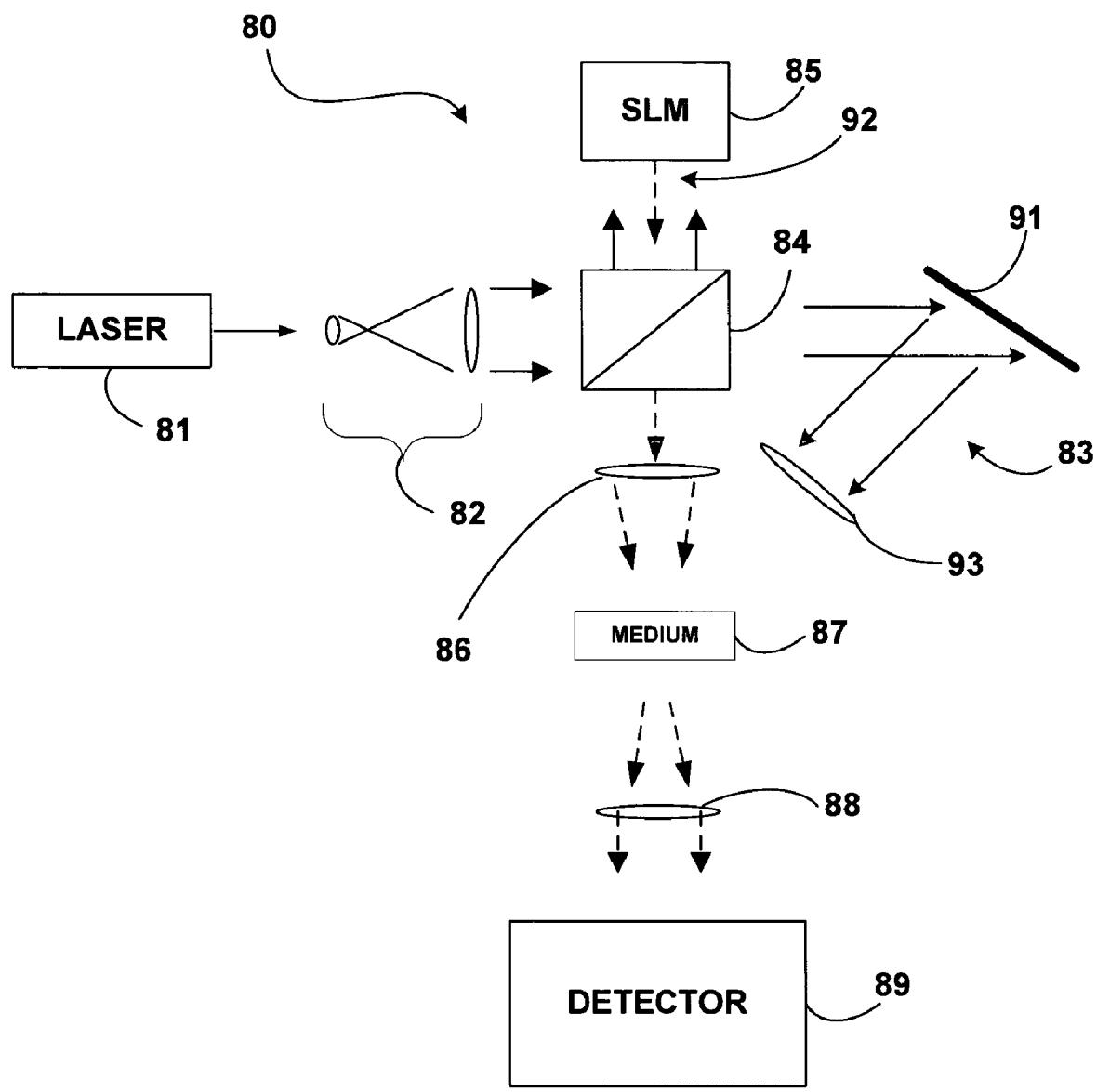

FIGS. 6–8 are block diagrams illustrating exemplary holographic data storage systems according to embodiments of the invention. In exemplary system 60 of FIG. 6, a laser 61 produces laser light that is divided into two components by beam splitter 62. These two components that exit beam splitter 62 generally have an approximately equal intensity and may be spatially filtered to eliminate optical wave-front errors.

The first component exits beam splitter 62 and follows an object path. This "object beam" may then pass through a collection of object beam optical elements 63A–63E and a data encoder comprising a spatial light modulator device (SLM) 65. For instance, lens 63A and lens 63B may form a laser beam expander to provide a collimated beam to SLM 65.

SLM 65 encodes data in the object beam, for instance, in the form of a holographic bit map (or pixel array). In particular, SLM 65 includes a set of controllable elements that can be individually controlled to define bit maps for holographic recording. The controllable optical elements comprise PDLC elements, as described herein, that can be made diffusive or transparent, or possibly more or less diffusive to define multiple states. In this manner, a holographic bit map is encoded into the object beam by SLM 65.

The encoded object beam may be scattered by the PDLC elements of SLM 65 that are made to be diffusive. As mentioned, the range of scattering angles is preferably less than the maximum capture range of the collection optics. In particular, if chosen lens 63C is an F/1 optic, maximum collection angle is approximately +/−26 degrees off-axis, and PDLC elements preferably scatter at angles less than +/26 degrees. Similarly, if chosen lens 63C is an F/2 optic, maximum collection angle is approximately +/−14 degrees off-axis, and PDLC elements preferably scatter at angles less than +/−14 degrees. The encoded object beam passes through lenses 63C, 63D, and 63E before illuminating a holographic recording media plane 58. Accordingly, the scattering should not be made excessive, to ensure that the light can be collected by lens 63C, 63D, and 63E. In this exemplary "4F" configuration, lens 63C is located one focal length from SLM 65 and one focal length from Fourier transform plane 64A. Lens 63D is located one focal length from Fourier transform plane 64A and one focal length from image plane 67A. Lens 63E is located one focal length from image plane 67A and one focal length from Fourier transform plane 64B.

The second light component of laser 61, which exits beam splitter 62, follows a reference path that is different from the object path. This "reference beam" is directed by reference beam optical elements such as lenses 68A–68C and mirrors 69A–69B. The reference beam illuminates the holographic recording media plane 58, interfering with the data encoded object beam to create a hologram on medium 55.

By way of example, medium 55 or other holographic media described herein may take the form of a disk or a card, or any other holographic media format. For example, medium 55 may have a sandwich construction in which a photosensitive material is sandwiched between two optically clear glass or plastic substrates. Tracking patterns may be included on the substrate, and may be read by a separate probe beam (not shown). The holograms generally comprise a pixel array or bit map that is encoded in the object beam. The object beam and reference beam interfere in the photosensitive material of medium 55 to create the hologram.

When recording a hologram, storage medium 55 is typically located at or near one of the Fourier transform planes. Using this system, the data encoded in the object beam by SLM 65 is recorded in medium 55 by simultaneously illuminating both the object and the reference paths so that the object beam and reference beam interfere in the photosensitive material of medium 55. Moreover, the scattering caused by the diffusive PDLC elements can reduce or eliminate undesirable zero-order burning that can otherwise overexpose portions of medium 55 during recording at or near Fourier transform plane 64B.

After a hologram has been stored on the medium 55, the data encoded in the hologram may be read by the system. A shutter (not shown) may be placed to block the object beam from illuminating the medium during readout. For readout of the data, only the reference beam is allowed to illuminate the hologram on medium 55. Light diffracts off the hologram stored on medium 55 to reconstruct or "re-create," the object beam. This reconstructed object beam passes through lens 63F, permitting a reconstruction of the bit map that was encoded in the object beam to be observed at image plane 67B. Therefore, a data detector, such as camera 59 can be positioned at image plane 67B to read the data encoded in the hologram. While the reconstructed object beam will include some slight scattering, the scattering will be minimal because diffusion occurs at the original image plane defined by the location of SLM 65.

The holographic bit map encoded by SLM 65 may comprise one "page" of holographic data. For instance, the page may be an array of binary information that is stored in a particular location on the holographic medium as a hologram. By way of example, a typical page of holographic data may comprise a 1000 bit by 1000 bit pixel array that is stored in a few square millimeters of medium surface area. In other cases, however, any sized pixel array could be defined. In general, the data capacity per page increases as the number of pixel elements increases and corresponding reduction in pixel element dimensions allows more pixels per holographic page. Moreover, more complex non-binary information may be encoded by defining different levels of diffusiveness for the different pixels. When sized for holographic data storage applications, the set of controllable PDLC elements of SLM 65 may collectively define a surface area less than 5 square centimeters and possibly less than 1 square centimeter. Moreover, each of the PDLC elements may define a surface area less than 400 square microns and more preferably less than 150 square microns.

System 70 of FIG. 7 is very similar to system 60 of FIG. 6. Both make use of a "4F" configuration for storage of Fourier transformed holograms. In system 70, however, the beam splitter is eliminated and the reference path is different. In particular, in system 70, the reference beam is created from a portion of the input light to SLM 75 that passes through the controllable PDLC elements that are made to be substantially transparent.

Laser 71 produces laser light that is conditioned by lenses optical elements 73A, 73B before illuminating SLM 75, which includes controllable PDLC elements as described herein. For instance, lens 73A and lens 73B may form a laser beam expander to provide a collimated beam to SLM 75. In this example, laser 71 is oriented so as to direct the input light toward SLM 75 in a non-perpendicular manner relative to a plane defined by the set of controllable PDLC elements of SLM 75. Accordingly, the portion of light transmitted through the PDLC elements that are made transparent are directed away from the object path and become reference beam 72.

SLM 75 encodes data in the object beam, for instance, in the form of a holographic bit map (or pixel array). In particular, SLM 75 includes a set of controllable PDLC elements, as described herein, that can be made diffusive or transparent, or possibly more or less diffusive to define multiple states. In this manner, a holographic bit map is encoded into the object beam by SLM 75.

The encoded object beam passes through lenses 73C, 73D, and 73E before illuminating a holographic recording media plane 74. Reference beam 72, which comprises the portion of light transmitted through the PDLC elements that are made transparent, follows a reference path that is different from the object path. This "reference beam" is directed by reference beam optical elements such as lens 78 and mirrors 79A–79B. The reference beam illuminates the holographic recording media plane 74, interfering with the data encoded object beam to create a hologram on medium 77.

After a hologram has been stored on the medium 77, the data encoded in the hologram may be read by the system. For readout of the data, only the reference beam is allowed to illuminate the hologram on medium 77. A shutter (not shown) may be placed to block the object beam from illuminating the medium during readout. Light diffracts off the hologram stored on medium 77 to reconstruct or "recreate," the object beam. This reconstructed object beam passes through lens 73F permitting a reconstruction of the bit map that was encoded in the object beam to be imaged by camera 95.

FIG. 8 is a block diagram illustrating yet another exemplary holographic recording system. System 80 includes a laser 81 to provide an input light source to system 80. One or more optical elements 82 can be used to condition the light from laser 81 in order to illuminate SLM 85. Light from laser 81 is conditioned by one or more optical elements 82 and reflected to SLM 85 by beam splitter 84.

SLM 85 includes a set of PDLC elements and also a mirror layer to cause reflection of the SLM output, e.g., as shown in SLM 20 of FIG. 2. The object beam 92 diffusively reflects from SLM 85 and passes through beam splitter 84 and lens 86, before interfering with reference beam 83 in a holographic medium 87 to record a hologram. Reference beam 83 may be created from light that exits beam splitter 84 and may be directed by one or more mirrors 91 and lenses 93. Alternatively, non-diffused light that reflects from those elements of SLM 85 that appear specular may be used to create a reference beam that travels along the same optical path as object beam 92. In that case, mirror 91 and lens 93 may not be needed.

Medium 87 may take the form of a disk or a card, or any other holographic media format. For example, medium 87 may have a sandwich construction in which a photosensitive material is sandwiched between two optically clear glass or plastic substrates. In order to read stored holograms in the illustrated example, spatial light modulator 85 is controlled to substantially block the light through the object path, or a shutter (not shown) may be added to block the object path, e.g., between beam splitter 84 and medium 87. When a stored hologram on medium 87 is illuminated only by reference beam 83 for that given hologram, a reconstruction of the data encoded object beam is created and can be detected by detector 89. For example, detector 89 may comprise a camera. One or more optical elements 88 may be used to condition the reconstructed object beam for proper illumination of the encoded pixel array onto detector 89. In this example, SLM 85 comprises a set of PDLC elements that can be made to appear diffusively reflective or specularly reflective. One or more mirror layers adjacent the PDLC elements can facilitate this reflective-mode effect.

Figure 9:
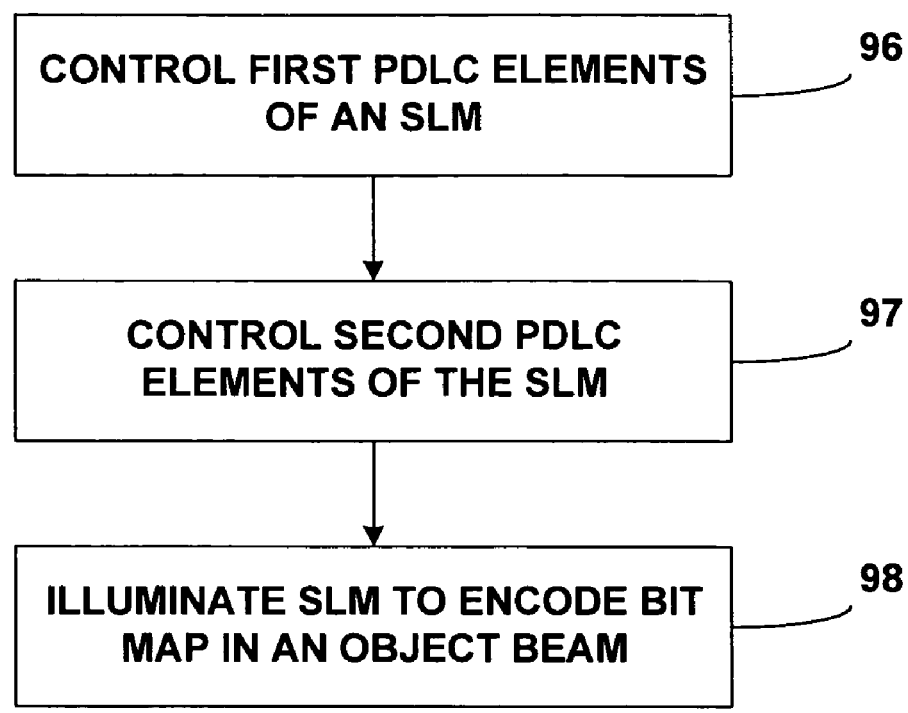
FIG. 9 is a flow diagram according to an embodiment of the invention.

FIG. 9 is a flow diagram according to an embodiment of the invention. FIG. 9 will be described with reference to SLM 30 of FIG. 3. Control unit 33 controls first PDLC elements of SLM 30 (96), and control unit 33 also controls second PDLC elements of SLM 30 (97). For example, first PDLC elements of SLM may comprise a subset of PDLC elements 34 and second PDLC elements may comprise a different subset of PDLC elements 34. As one illustrative example, the shaded ones of elements 34 may comprise the first subset and the non-shaded ones of elements 34 may comprise the second subset. Controlling the first PDLC elements may comprise applying a first electric field to the first PDLC elements, and controlling the second PDLC elements may comprise applying a second electric field to the second PDLC elements. In that case, additional subsets of PDLC elements may also be controlled with different electrical field levels.

Alternatively, controlling the first PDLC elements may comprise applying an electric field to the first PDLC elements, and controlling the second PDLC elements may comprise applying no electric field to the second PDLC elements. In that case, the pixels of SLM 30 would be either "on" or "off." In any case, SLM 30 is illuminated to encode a bit map into an object beam (98). Moreover, in some cases, a reference beam may be generated from input light that is transmitted through PDLC elements that are controlled to be transmissive.

A number of embodiments of the invention have been described. For example, an SLM has been described that may be specifically advantageous for holographic data recording systems. The SLM incorporates controllable PDLC elements that control input light on a pixel-by-pixel basis. Nevertheless, various modifications may be made to the embodiments described herein. For example, numerous other holographic recording arrangements could also make use of the SLM described herein, and some non-holographic applications may benefit as well. These and other embodiments are within the scope of the following claims.

The invention claimed is:

1. A method comprising:
    controlling first polymer dispersed liquid crystal (PDLC) elements of a spatial light modulator such that the first PDLC elements are substantially transparent;
    controlling second PDLC elements of the spatial light modulator such that the second PDLC elements are substantially diffusive;
    illuminating the spatial light modulator to encode a pixel array into an object beam of a holographic data storage system; and
    generating a reference beam from light transmitted through the first PDLC elements.

2. The method of claim 1, wherein controlling the first PDLC elements comprises applying an electric field to the first PDLC elements, and wherein controlling the second PDLC elements comprises applying no electric field to the second PDLC elements.

3. The method of claim 1, wherein the first and second PDLC elements reside within a common array of PDLC elements, and wherein the common array PDLC elements is a two-dimensional array.

4. The method of claim 1, further comprising causing the object beam and reference beam to interfere in a holographic data storage medium.

5. A method comprising:
    controlling first polymer dispersed liquid crystal (PDLC) elements of a spatial light modulator such that the first PDLC elements define a first level of transmissiveness and a first level of diffusiveness;
    controlling second PDLC elements of the spatial light modulator such that the second PDLC elements define a second level of transmissiveness and a second level of diffusiveness; and
    illuminating the spatial light modulator to create an object beam and a reference beam of a holographic data storage system, wherein a pixel array is encoded into the object beam.

6. The method of claim 5, further comprising controlling third PDLC elements of the spatial light modulator such that the third PDLC elements define a third level of transmissiveness and a third level of diffusiveness.

7. The method of claim 6, further comprising controlling fourth PDLC elements of the spatial light modulator such that the fourth PDLC elements define a fourth level of transmissiveness and a fourth level of diffusiveness.

8. The method of claim 5, wherein controlling the first PDLC elements comprises applying a first electric field to the first PDLC elements, and wherein controlling the second PDLC elements comprises applying a second electric field to the second PDLC elements.

9. The method of claim 5, wherein controlling the first PDLC elements comprises applying an electric field to the first PDLC elements, and wherein controlling the second PDLC elements comprises applying no electric field to the second PDLC elements.

* * * * *